(12) United States Patent
Hishiki et al.

(10) Patent No.: US 10,305,007 B2
(45) Date of Patent: May 28, 2019

(54) MULTI-ROW LED WIRING MEMBER AND METHOD FOR MANUFACTURING THE SAME

(71) Applicant: OHKUCHI MATERIALS CO., LTD., Kagoshima (JP)

(72) Inventors: Kaoru Hishiki, Kagoshima (JP); Kazunori Iitani, Kagoshima (JP)

(73) Assignee: OHKUCHI MATERIALS CO., LTD., Kagoshima (JP)

( * ) Notice: Subject to any disclaimer, the term of this patent is extended or adjusted under 35 U.S.C. 154(b) by 0 days.

(21) Appl. No.: 15/661,479

(22) Filed: Jul. 27, 2017

(65) Prior Publication Data

US 2018/0033933 A1    Feb. 1, 2018

(30) Foreign Application Priority Data

Jul. 27, 2016  (JP) ................. 2016-147562

(51) Int. Cl.
| | | |
|---|---|---|
| *H01L 33/62* | (2010.01) | |
| *H01L 33/60* | (2010.01) | |
| *H01L 33/48* | (2010.01) | |
| H01L 23/00 | (2006.01) | |

(52) U.S. Cl.
CPC ............ *H01L 33/62* (2013.01); *H01L 33/483* (2013.01); *H01L 33/60* (2013.01); *H01L 24/48* (2013.01); *H01L 33/486* (2013.01); *H01L 2224/48247* (2013.01); *H01L 2933/0033* (2013.01); *H01L 2933/0066* (2013.01)

(58) Field of Classification Search
CPC ....... H01L 33/62; H01L 33/483; H01L 33/60; H01L 33/486; H01L 2933/0066
See application file for complete search history.

(56) References Cited

U.S. PATENT DOCUMENTS

| | | | | |
|---|---|---|---|---|
| 2013/0299859 A1* | 11/2013 | Onai | ........................ | H01L 33/58 257/98 |
| 2013/0307000 A1* | 11/2013 | Ikenaga | ................ | H01L 33/486 257/91 |
| 2015/0060920 A1* | 3/2015 | Horikawa | ............... | H01L 33/60 257/98 |
| 2016/0181493 A1* | 6/2016 | Miki | ........................ | H01L 33/62 257/99 |

FOREIGN PATENT DOCUMENTS

| | | |
|---|---|---|
| JP | 2013-232506 | 11/2013 |
| JP | 2015-124427 | 7/2015 |

* cited by examiner

*Primary Examiner* — Julia Slutsker
(74) *Attorney, Agent, or Firm* — Wenderoth, Lind & Ponack, L.L.P.

(57) ABSTRACT

A multi-row LED wiring member includes a first plating layer, a second plating layer and a resin layer, to form individual wiring members arrayed in a matrix. In each wiring member, the first plating layer and the second plating layer constitute a laminated piece to form a pad portion and a laminated piece to form a lead portion. A first surface of the first plating layer is uncovered on a first-surface side of the resin layer. The second plating layer is formed on a part of a second surface of the first plating layer as being uncovered on a second-surface side of the resin layer. The laminated pieces substantially have a T-shape or L-shape as viewed from a lateral side. The first surface of the first plating layer is a surface of an Ag plating layer formed by removal of a metal plate, to maintain a good reflectance without brightener.

6 Claims, 8 Drawing Sheets

MULTI-ROW LED WIRING MEMBER AND METHOD FOR MANUFACTURING THE SAME

CROSS-REFERENCE TO RELATED PATENT APPLICATIONS

This application claims the benefit of Japanese Patent Application No. 2016-147562 filed in Japan on Jul. 27, 2016, the contents of which are incorporated herein by reference.

BACKGROUND OF THE INVENTION

1) Field of the Invention

The present invention relates to a multi-row LED wiring member for mounting an LED element, and a method for manufacturing the same.

2) Description of Related Art

Optical semiconductor devices equipped with LED (Light Emitting Diode) elements have come to be used in various apparatuses such as general lights, televisions, mobile phones and displays for OA devices.

In these optical semiconductor devices, as LED packages that have been developed to meet the demand for thinning and mass production, there are conventional LED packages in each of which an LED element is mounted on a lead frame having electrically insulated pad portion and lead portion, a reflector resin portion is formed to surround the pad portion and the lead portion on the side where the LED element is mounted, and the inside space surrounded by the reflector resin portion on the LED-element mount side is sealed with a transparent resin portion.

In this type of LED package, for example, as shown in FIG. 7A, the lead frame 50 has a pad portion 51 and a lead portion 52 disposed with a space from the pad portion 51, and, on the upper surface and the lower surface of the pad portion 51 and the lead portion 52, a plating layer 53 for reflection or connection with external is formed. On the upper-surface side of the lead frame 50, an LED element 60 is mounted on the pad portion 51, and the LED element 60 and the lead portion 52 are connected via a bonding wire 54 or the like. Around the LED element 60, a reflector resin portion 55, which reflects light, is formed to surround the pad portion 51 and the lead portion 52. An inside space surrounded by the reflector resin portion 55 on the side where the LED element 60 is mounted is sealed with a transparent resin portion 56 made of a transparent resin.

As shown in FIGS. 8A-8C, a lead frame used for manufacturing this type of LED package is provided in the form of a multi-row LED lead frame in which individual lead frame regions (shown as individual rectangles drawn by alternate long and double short dashed lines in FIG. 8B) each configured of a combination of a pad portion 51 and a lead portion 52 are arrayed in a matrix, for the purpose of obtaining a large number of LED packages in bulk. As shown in FIG. 8B, each of the pad portion 51 and the lead portion 52 is connected with a coupling portion 57 (indicated by hatching in FIG. 8B) formed from a metal plate as a base material of the lead frame, and is coupled with pad portions 51 and lead portions 52 of other lead frame regions and with an outer frame portion 58 of the metal plate for manufacturing the multi-row LED lead frame, via the coupling portions 57.

In manufacturing of this type of LED package, as shown in FIG. 7B, the reflector resin portions 55 for the respective lead frame regions in the multi-row LED lead frame are formed in bulk as covering the coupling portions 57, the LED elements 60 are mounted and fixed on the pad portions 51 surrounded by the respective reflector resin portions 55 and are subjected to wire bonding or the like, the transparent resin portions 56 are formed in the inside spaces thereof, and then a part of the reflector resin portions 55 formed in bulk and a part of the coupling portions 57 are simultaneously cut along cutting portions between the respective lead frame regions.

As shown in FIG. 7A, this cutting process produces individual LED packages each having the pad portion 51 and the lead portion 52 uncovered on the lower surface side to be electrically connectable with an external substrate. On a side face of each LED package, the coupling portion 57 of the lead frame is exposed as a part of the cut surface together with the reflector resin portion 55.

A conventional LED package having such a configuration is described, for example, in Japanese Patent Application KOKAI No. 2013-232506.

In addition, conventionally, in an LED lead frame, a bright Ag plating layer is formed on the upper surface of the pad portion and the lead portion to enhance light reflection characteristics. For the purpose of attaining a glossiness of 1.0 or more, a brightener containing Se or S is used as an additive in the Ag plating solution.

A technique for forming an Ag plating film having a glossiness of 1.0 or more by using such an Ag plating solution is described, for example, in Japanese Patent Application KOKAI No. 2015-124427.

As described above, regarding LED package manufacturing, for the purpose of obtaining a large number of LED packages in bulk, there is used a multi-row LED lead frame configured so that a pad portion 51 and a lead portion 52 in each lead frame region as shown in FIG. 8B are coupled with pad portions 51 and lead portions 52 of other lead frame regions and with an outer frame portion 58 of a metal plate, which is for manufacturing a multi-row LED lead frame, via coupling portions 57.

Also, the LED lead frame is provided with a reflective plating layer formed, by Ag plating, on the outermost layer of the pad portion and the lead portion of the metal plate, which serves as a lead frame substrate, for improving the reflectance of the LED element mount region.

This Ag plating layer is a bright Ag plating having a glossiness of 1.0 or more and formed by using an Ag plating solution to which a brightener is added in an Ag plating bath as described above. However, forming a bright Ag plating using an Ag plating solution containing a brightener added to an Ag plating bath requires concentration control of the brightener in the Ag plating bath, and furthermore, addition of the brightener raises the product cost.

The present invention has been made in view of the above problems, and it is an object of the present invention to provide a multi-row LED wiring member and a manufacturing method therefor in which the reflectance of the surface of a reflective plating layer can be maintained without addition of a brightener.

SUMMARY OF THE INVENTION

In order to attain the above-described object, a multi-row LED wiring member according to one aspect of the present invention includes a first plating layer, a second plating layer and a resin layer, to form a plurality of wiring members arrayed in a matrix, in each of which the first plating layer and the second plating layer form a laminated piece that is to form a pad portion and a laminated piece that is to form a lead portion, wherein the first plating layer is formed to have a first surface thereof uncovered on a side of a first surface of the resin layer, the second plating layer is formed on a partial region within a region of a second surface of the first plating layer, to have a surface thereof uncovered on a side of a second surface of the resin layer, the laminated pieces substantially have a T-shape or L-shape as viewed from a lateral side, and the first surface of the first plating layer is a surface of an Ag plating layer formed by removal of a metal plate.

In the multi-row LED wiring member of this aspect, it is preferable that the Ag plating layer of the first plating layer is an Ag plating layer not containing Se or S.

In the multi-row LED wiring member of this aspect, it is preferable that the glossiness of the surface of the Ag plating layer is 1.0 or greater.

In the multi-row LED wiring member of this aspect, it is preferable that the second surface of the first plating layer is a roughened surface and/or the first surface of the resin layer is a rough surface.

In the multi-row LED wiring member of this aspect, the resin layer preferably is made of a permanent resist.

A method for manufacturing a multi-row LED wiring member according to another aspect of the present invention includes: a step of forming, out of a photoresist, on one surface of a metal plate, a first resist mask having openings in a pattern A; a step of forming a first plating layer including an Ag plating layer in the openings in the first resist mask in such a manner that the Ag plating layer is in contact with the metal plate; a step of removing the first resist mask; a step of forming, out of a photoresist, on the surface of the metal plate, a second resist mask having openings in a pattern B that leave a partial region within a region of the first plating layer uncovered; a step of forming a second plating layer, which is to become external terminals, in the openings in the second resist mask; a step of removing the second resist mask; a step of forming a resin layer at sites that are free from the second plating layer on the surface of the metal plate and the first plating layer, while leaving a surface of the second plating layer uncovered; and a step of removing the metal plate.

In the method for manufacturing a multi-row LED wiring member of this aspect, it is preferable that the first plating layer includes, in order from the metal-plate side, an Ag plating layer not containing Se or S, a Pd plating layer, and a Ni plating layer.

Also, a method for manufacturing a multi-row LED wiring member according to still another aspect of the present invention includes: a step of forming, out of a photoresist, on one surface of a metal plate, a first resist mask having openings in a pattern A; a step of forming a first plating layer including an Ag plating layer in the openings in the first resist mask in such a manner that the Ag plating layer is in contact with the metal plate; a step of removing the first resist mask; a step of forming, out of a permanent resist, on the surface of the metal plate, a second resist mask having openings in a pattern B that leave a partial region within a region of the first plating layer uncovered; a step of forming a second plating layer, which is to become external terminals, in the openings in the second resist mask; and a step of removing the metal plate.

In the method for manufacturing a multi-row LED wiring member of this aspect, it is preferable that the first plating layer includes, in order from the metal-plate side, an Ag plating layer not containing Se or S, a Pd plating layer and a Ni plating layer.

A method for manufacturing a multi-row LED wiring member according to still another aspect of the present invention includes: a step of forming, out of a first permanent resist, on one surface of a metal plate, a first resist mask having openings in a pattern A; a step of forming a first plating layer including an Ag plating layer in the openings in the first resist mask in such a manner that the Ag plating layer is in contact with the metal plate; a step of forming, out of a second permanent resist, on the first resist mask and the first plating layer, a second resist mask having openings in a pattern B that leave a partial region within a region of the first plating layer uncovered; a step of forming a second plating layer, which is to become external terminals, in the openings in the second resist mask; and a step of removing the metal plate.

A method for manufacturing a multi-row LED wiring member according to still another aspect of the present invention includes: a step of forming, out of a first permanent resist, on one surface of a metal plate, a first resist mask having openings in a pattern A; a step of forming, out of a second permanent resist, on the first resist mask, a second resist mask having openings in a pattern B that leave a partial region within a region of the openings in the first resist mask uncovered; a step of forming a first plating layer including an Ag plating layer in the openings in the first resist mask in such a manner that the Ag plating layer is in contact with the metal plate; a step of forming a second plating layer, which is to become external terminals, in the openings in the second resist mask; and a step of removing the metal plate.

A method for manufacturing a multi-row LED wiring member according to still another aspect of the present invention includes: a step of providing a first resist layer made of a first permanent resist covering an entirety of a surface of a metal plate and of providing a second resist layer made of a second permanent resist covering an entirety of a surface of the first resist layer; a step of forming a first resist mask having openings in a pattern A by exposing the first resist layer with a first wavelength and of forming a second resist mask having openings in a pattern B that leave a partial region within a region of the openings in the first resist mask uncovered, by exposing the second resist layer with a second wavelength; a step of forming a first plating layer including an Ag plating layer in the openings in the first resist mask in such a manner that the Ag plating layer is in contact with the metal plate; a step of forming a second plating layer, which is to become external terminals, in the openings in the second resist mask; and a step of removing the metal plate.

According to the present invention, it is possible to obtain a multi-row LED wiring member and a manufacturing method therefor in which the reflectance of the surface of the reflective plating layer can be maintained without addition of a brightener.

This and other objects as well as features and advantages of the present invention will become apparent from the following detailed description of the preferred embodiments when taken in conjunction with the accompanying drawings.

BRIEF DESCRIPTION OF THE DRAWINGS

FIG. 1A is a plan view of the multi-row LED substrate or multi-row LED wiring member as viewed from the external-terminal side, FIG. 1B is a plan view that shows one example of configuration of laminated pieces of plating layers and a resin layer in each of individual LED substrate regions or LED wiring member regions arranged in the multi-row LED substrate or multi-row LED wiring member shown in FIG. 1A, FIG. 1C is a cross-sectional view taken along a line B-B of FIG. 1B, FIG. 1D is a cross-sectional view that shows an example of each individual LED substrate, FIG. 1E is a cross-sectional view that shows a first example of each individual LED wiring member, and FIG. 1F is a cross-sectional view that shows a second example of each individual LED wiring member.

FIGS. 2A to 2I show a manufacturing procedure for the multi-row LED substrate shown in FIG. 1D, FIGS. 2A to 2J show a manufacturing procedure for the first example of multi-row LED wiring member shown in FIG. 1E, and FIGS. 2A to 2K show a manufacturing procedure for the second example of multi-row LED wiring member shown in FIG. 1F.

FIGS. 4A to 4H show a manufacturing procedure for the multi-row LED substrate shown in FIG. 1D, FIGS. 4A to 4I show a manufacturing procedure for the first example of multi-row LED wiring member shown in FIG. 1E, and FIGS. 4A to 4J show a manufacturing procedure for the second example of multi-row LED wiring member shown in FIG. 1F.

FIGS. 5A to 5G show a manufacturing procedure for the multi-row LED substrate shown in FIG. 1D, FIGS. 5A to 5H show a manufacturing procedure for the first example of multi-row LED wiring member shown in FIG. 1E, and FIGS. 5A to 5I show a manufacturing procedure for the second example of multi-row LED wiring member shown in FIG. 1F.

FIGS. 6A to 6E show a manufacturing procedure for the multi-row LED substrate shown in FIG. 1D, FIGS. 6A to 6F show a manufacturing procedure for the first example of multi-row LED wiring member shown in FIG. 1E, and FIGS. 6A to 6G show a manufacturing procedure for the second example of multi-row LED wiring member shown in FIG. 1F.

FIG. 7A is a cross-sectional view of an LED package as being cut into one product, FIG. 7B is a partial cross-sectional view that shows cutting portions of the multi-row LED package manufactured in bulk before being cut.

FIG. 8A is a plan view that schematically shows an arrangement of individual lead frames in the multi-row LED lead frame, FIG. 8B is an enlarged partial plan view of FIG. 8A for showing, from the bottom side, an arrangement of a pad portion and a lead portion in each individual lead frame region in the multi-row LED lead frame used for manufacturing the LED package of the type shown in FIGS. 7A and 7B, and FIG. 8C is a cross-sectional view taken along the line A-A of FIG. 8B.

DETAILED DESCRIPTION OF THE PREFERRED EMBODIMENTS

Figure 1A:
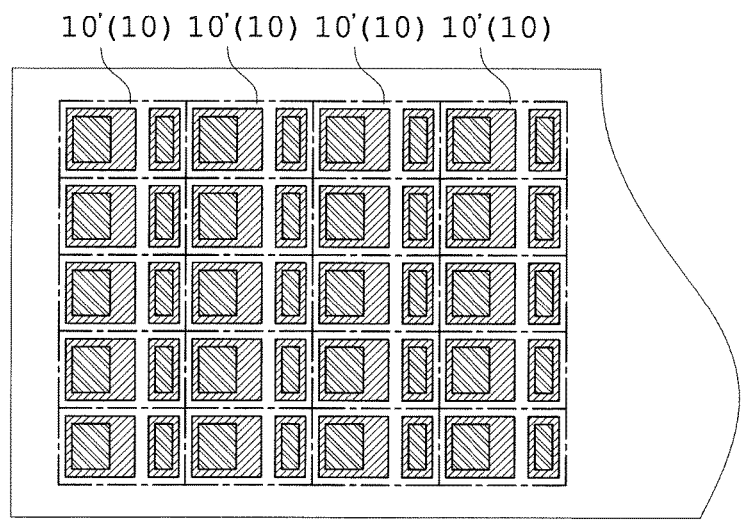
FIGS. 1A to 1F are diagrams that show a configuration of a multi-row LED substrate and a multi-row LED wiring member according to one aspect of the present invention.

Preceding the description of the embodiment modes, the circumstances leading up to the present invention and the effects of the present invention will be described.

As described above, the present inventors have studied for improvement in reflection efficiency of the surface of the reflective plating layer in an LED lead frame, and has found that formation of the reflective plating layer should be improved in view of maintaining the reflectance of the surface of the reflective plating layer without adding a brightener.

To be more specific, the present inventors have repeated trial and error regarding a method for forming, by use of an Ag plating solution containing no brightener, a reflective plating layer having an Ag plating layer as the uppermost layer that can maintain a reflectance comparable to that of the top surface of an Ag plating layer formed by use of an Ag plating solution containing a brightener, as the uppermost layer of a reflective plating layer formed by, as conventionally conducted, plating a metal plate of Cu or the like as a lead frame base material.

It finally has been found that forming an Ag plating layer on a metal plate using an Ag plating solution containing no brightener and then removing the metal plate can maintain the reflectance of the metal-plate-removal side surface of the Ag plating layer to be comparable to that of the top surface of an Ag plating layer formed by use of an Ag plating solution containing a brightener, as the uppermost layer of a reflective plating layer formed by, as conventionally conducted, plating a metal plate of Cu or the like as a lead frame base material.

In view of the above, the present inventors have introduced the multi-row LED wiring member and the manufacturing method therefor of the present invention in which a surface of an Ag plating layer that has come out after removal of a metal plate plated with the Ag plating layer by use of an Ag plating solution free from brightener serves as a reflective surface of a reflective plating layer.

The multi-row LED wiring member according to the present invention includes a first plating layer, a second plating layer and a resin layer, to form a plurality of wiring members arrayed in a matrix, in each of which the first plating layer and the second plating layer constitute a laminated piece that is to form a pad portion and a laminated piece that is to form a lead portion, wherein the first plating layer is formed to have a first surface thereof uncovered on a side of a first surface of the resin layer, the second plating layer is formed on a partial region within a region of a second surface of the first plating layer, to have a surface thereof uncovered on a side of a second surface of the resin layer, the laminated pieces substantially have a T-shape or L-shape as viewed from a lateral side, and the first surface of the first plating layer is a surface of an Ag plating layer formed by removal of a metal plate.

In a configuration made so that the first surface of the first plating layer is a surface of an Ag plating layer formed by removal of a metal plate as in the present invention, even if the Ag plating layer is formed by use of an Ag plating solution to which no brightener is added, the reflectance of the metal-plate-removal side surface of the Ag plating layer can be maintained to be comparable to that of the top surface of an Ag plating layer formed by use of an Ag plating solution containing a brightener, as the uppermost layer of a reflective plating layer formed by, as conventionally conducted, plating a metal plate of Cu or the like as a lead frame base material. Therefore, in the LED wiring member, the first plating layer is made to serve as a reflective plating layer on the side where an LED element is to be mounted. The configuration as in the multi-row LED wiring member of the present invention thus can maintain the reflectance of the surface of the reflective plating layer without adding a brightener.

This point will be explained in more detail. In a conventional LED wiring member, in forming a reflective plating layer that has an AG plating layer as the uppermost layer by plating a metal plate of Cu or the like as a lead frame base material, a bright Ag metal solution, which is prepared by adding a brightener to an Ag plating solution, is used for enhancing the reflectance of the top surface of the uppermost Ag plating layer. Addition of the brightener raises the cost as well as the bright Ag plating solution used in manufacturing is very difficult to control. In contrast, matte Ag plating, which uses an Ag plating solution containing no brightener, is cost-saving, for absence of brightener, as compared with the bright Ag plating, as well as the plating solution for it is easy to control. However, if a matte Ag plating solution is used in forming a reflective plating layer having an uppermost Ag plating layer by plating a metal plate of Cu or the like as a conventional lead frame base material, the surface of the matte Ag plating layer to be formed has a low glossiness, to fail to achieve a reflection efficiency for LED light suitable for an LED package.

However, if the surface of the Ag plating layer uncovered by removal of the metal plate is used as the reflective surface as in the multi-row LED wiring member of the present invention, it is possible to maintain the reflectance of the surface of the Ag plating layer. Accordingly, even if the reflective surface is formed by matte Ag plating for saving of manufacturing cost and easier control of the plating solution in manufacturing, a reflection efficiency for LED light suitable for an LED package can be achieved.

In the multi-row LED wiring member of the present invention, the Ag plating layer of the first plating layer preferably is an Ag plating layer not containing Se or S.

In general, brighteners contain Se or S. Therefore, conducting plating by use of an Ag plating solution not containing a brightener forms an Ag plating layer not containing Se or S.

That is, for forming an Ag plating layer not containing Se or S, addition of a brightener containing Se or S is dispensable, and thus the cost can be reduced for it.

In the multi-row LED wiring member of the present invention, the second surface of the first plating layer preferably is a roughened surface.

This feature improves adhesion to the resin layer.

In the multi-row LED wiring member of the present invention, the first surface of the resin layer is a rough surface.

This feature improves adhesion to a reflector resin portion formed on the LED-element mount side and to a transparent resin that seals the LED mount region.

If the first plating layer and the second plating layer, which is to form external terminals, constitute laminated pieces as in the multi-row LED wiring member of the present invention, the instrumentation pitch of LED-element mount portions with internal terminals and the instrumentation pitch of external terminals are individually adjustable in accordance with design.

In the configuration where the laminated pieces constituted of the first plating layer and the second plating layer have a T-shape or L-shape as viewed from a lateral side, the adherence to the resin layer is improved, to prevent the coating by plating, which forms LED-element mount portions and terminals, from coming off the resin layer.

In the configuration where the second plating layer is formed on a partial region within a region of the second surface of the first plating layer, pieces of the second plating layer, which are to form external terminals, can be made small, to prevent the second plating layer, which is uncovered on the back surface of the LED package, from falling off or coming off.

If a multi-row LED wiring member is constituted only of a laminated coating by plating and a resin layer as in the present invention, to forma reflector resin portion around pad portions and lead portions on the LED-element-mount side or to resin-seal LED elements after instrumentation with a transparent resin means to seal only the resin layer and the coating by plating as uncovered in the multi-row LED wiring member with the reflector resin or the transparent resin without resin-sealing a surface of a base material (metal plate) having a greatly different expansion coefficient, and thus warpage after curing of the sealing resin is reduced. In more detail, as compared with resin-sealing of a metal plate serving as a base material, resin-sealing of the resin layer constituting the multi-row LED wiring member involves a small difference in thermal contraction and thermal expansion after curing of the sealing resin between the resin layer and the sealing resin, for these two materials are of the same type having similar physical characteristics. As a result, warpage after curing of the sealing resin is made small.

Also, if the multi-row LED wiring member constituted only of a laminated coating by plating and a resin layer as in the present invention is used for manufacturing a multi-row LED package, in obtaining individual LED packages from the multi-row LED package in which a plurality of LED package regions are arrayed, almost all the portions to be cut by blades are of the resin layer and the reflector resin portion, except a small part of the outer frame portion.

As a result, the amount of metal, which forms the base material of the lead frame, to be cut can be greatly reduced as compared with a conventional LED package having coupling portions as in the LED package described in JP KOKAI No. 2013-232506. It is possible to remarkably reduce unfavorable influence on the blades in the cutting process and to prolong the continuous productivity and life of the blades.

Also, if the configuration is made as in the multi-row LED wiring member of the present invention, since the pad portions and the lead portions are formed to be spaced from each other and are fixed by the resin layer, in the manufacturing procedure of LED packages, it is not necessary, after a transparent resin portion being provided to fill inside spaces where LED elements are mounted, to perform etching against a metal plate forming a lead frame base material as conventionally would have been performed for separating the pad portions and the lead portions.

As a result, that the transparent resin portion would never come into contact with an etchant, which would alter the surface quality thereof for a lower transmittance, relieves the anxiety about quality deterioration such as a weakened amount of illumination light from LED devices to be manufactured.

Further, that the etching is dispensable after the transparent resin portion is provided in the manufacturing procedure of LED packages relieves an anxiety that an etchant would infiltrate the LED mount region filled with the transparent resin portion from the interface between the transparent resin portion and the reflector resin portion to unfavorably affects the circuit of the LED devices.

Also, if a multi-row LED wiring member is constituted only of a laminated coating by plating and a resin layer as in the present invention, at the stage where there has been manufactured a multi-row LED package in which a plurality of LED package regions are arrayed, which is a pre-stage for obtaining individual LED packages, laminated pieces constituting a pad portion and a lead portion in each individual lead frame region, laminated pieces constituting pad portions and lead portions in other lead frame regions, and the resin layer used in manufacturing the multi-row lead frame are integrally connected together without being separated, and there is no coupling portions made of a metal as a lead frame base material.

As a result, the width between the pad portion or the lead portion in each lead frame region and the pad portions or the lead portions in other lead frame regions can be narrowed, so that a larger number of individual lead frames can be formed within the area for forming a multi-row LED lead frame, to achieve remarkable integration in manufacturing. Moreover, unlike the LED package described in JP KOKAI No. 2013-232506, it is not necessary to endeavor to design the pad portion and the lead portion regarding shapes thereof and positions thereat to be connected with the coupling portion for preventing deformation of the connecting portion. Therefore, a greater latitude is given about design of the pad portion and the lead portion.

In the multi-row LED wiring member of the present invention, the resin layer is made of a resin member or a permanent resist.

The multi-row LED wiring member of the present invention can be manufactured by a method that includes: a step of forming, out of a photoresist, on one surface of the metal plate, a first resist mask having openings in a pattern A; a step of forming the first plating layer including the Ag plating layer in the openings in the first resist mask in such a manner that the Ag plating layer is in contact with the metal plate; a step of removing the first resist mask; a step of forming, out of a photoresist, on the surface of the metal plate, a second resist mask having openings in a pattern B that leave a partial region within a region of the first plating layer uncovered; a step of forming the second plating layer, which is to become external terminals, in the openings in the second resist mask; a step of removing the second resist mask; a step of forming the resin layer at sites that are free from the second plating layer on the surface of the metal plate and the first plating layer, while leaving a surface of the second plating layer uncovered; and a step of removing the metal plate.

It is preferable that the first plating layer includes, in order from the metal-plate side, an Ag plating layer not containing Se or S, a Pd plating layer, and a Ni plating layer.

The multi-row LED wiring member of the present invention can be manufactured also by another method that includes: a step of forming, out of a photoresist, on one surface of the metal plate, a first resist mask having openings in a pattern A; a step of forming the first plating layer including the Ag plating layer in the openings in the first resist mask in such a manner that the Ag plating layer is in contact with the metal plate; a step of removing the first resist mask; a step of forming, out of a permanent resist, on the surface of the metal plate, a second resist mask having openings in a pattern B that leave a partial region within a region of the first plating layer uncovered; a step of forming the second plating layer, which is to become external terminals, in the openings in the second resist mask; and a step of removing the metal plate.

The multi-row LED wiring member of the present invention can be manufactured also by still another method that includes: a step of forming, out of a first permanent resist, on one surface of the metal plate, a first resist mask having openings in a pattern A; a step of forming the first plating layer including the Ag plating layer in the openings in the first resist mask in such a manner that the Ag plating layer is in contact with the metal plate; a step of forming, out of a second permanent resist, on the first resist mask and the first plating layer, a second resist mask having openings in a pattern B that leave a partial region within a region of the first plating layer uncovered; a step of forming the second plating layer, which is to become external terminals, in the openings in the second resist mask; and a step of removing the metal plate.

This method allows the step of removing, from the metal plate, the first resist mask used for forming the first plating layer to be omitted, thereby to decrease the manufacturing cost accordingly as well as to improve efficiency of manufacture.

The multi-row LED wiring member of the present invention can be manufactured also by still another method that includes: a step of forming, out of a first permanent resist, on one surface of the metal plate, a first resist mask having openings in a pattern A; a step of forming, out of a second permanent resist, on the first resist mask, a second resist mask having openings in a pattern B that leave a partial region within a region of the openings in the first resist mask uncovered; a step of forming the first plating layer including the Ag plating layer in the openings in the first resist mask in such a manner that the Ag plating layer is in contact with the metal plate; a step of forming the second plating layer, which is to become external terminals, in the openings in the second resist mask; and a step of removing the metal plate.

This method allows the first plating layer and the second plating layer to be formed in one plating process, thereby to achieve much improved efficiency of manufacture.

The multi-row LED wiring member of the present invention can be manufactured also by still another method that includes: a step of providing a first resist layer made of a first permanent resist covering an entirety of a surface of the metal plate and of providing a second resist layer made of a second permanent resist covering an entirety of a surface of the first resist layer; a step of forming a first resist mask having openings in a pattern A by exposing the first resist layer with a first wavelength and of forming a second resist mask having openings in a pattern B that leave a partial region within a region of the openings in the first resist mask uncovered, by exposing the second resist layer with a second wavelength; a step of forming the first plating layer including an Ag plating layer in the openings in the first resist mask in such a manner that the Ag plating layer is in contact with the metal plate; a step of forming the second plating layer, which is to become external terminals, in the openings in the second resist mask; and a step of removing the metal plate.

This method allows the first resist mask having pattern-A openings and the second resist mask having pattern-B openings to be formed by one exposure process, thereby to achieve much improved efficiency of manufacture.

In a case where the multi-row LED wiring member of the present invention is such that its previous form at the stage before removal of the metal plate, or a multi-row LED substrate has the metal plate made of a Cu material, the first surface of the first plating layer (the surface of the Ag plating layer), which is uncovered on the side of the first surface of the resin layer made of a permanent resist or a resin member, to become internal terminals, is formed by dissolving the Cu material.

In a case where the multi-row LED wiring member of the present invention is such that its previous form at the stage before removal of the metal plate, or a multi-row LED substrate has the metal plate made of an SUS material, the first surface of the first plating layer (the surface of the Ag plating layer), which is uncovered on the side of the first surface of the resin layer made of a permanent resist or a resin member, to become internal terminals, may be formed by ripping off the SUS material.

In this way, according to the present invention, it is possible to obtain a multi-row LED wiring member and a manufacturing method therefor in which the reflectance of the surface of the reflective plating layer can be maintained without addition of a brightener. Also, according to the present invention, it is possible to obtain a multi-row LED wiring member and a manufacturing method therefor in which: warpage after curing of the sealing resin can be reduced; the continuous productivity and life of blades used in the process of cutting into individual LED packages are allowed to be prolonged; the transparent resin portion filling the LED-element mount portion is free from influence by an etchant; the LED-element mount portion is free from infiltration by an etchant; and a great latitude is given about design.

Hereinafter, embodiment modes of the present invention will be described in reference to the drawings.

First Embodiment Mode

Figure 1B:
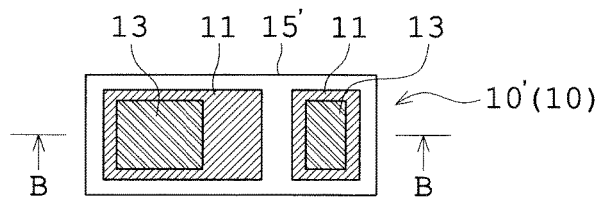
Figure 1C:
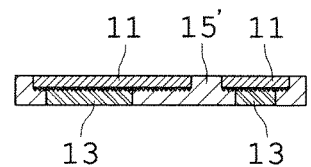
Figure 1D:
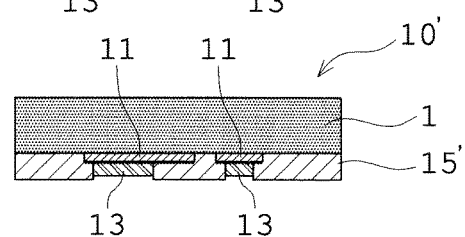
Figure 1E:
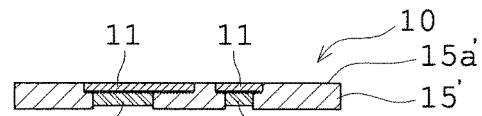
Figure 1F:
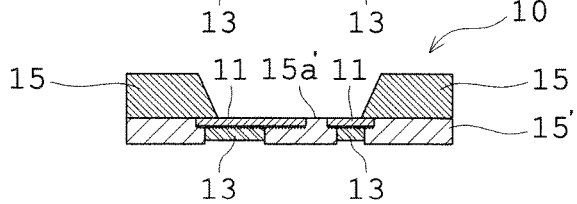

FIGS. 1A to 1F are diagrams that show a configuration of a multi-row LED substrate and a multi-row LED wiring member according to one aspect of the present invention; FIG. 1A is a plan view of the multi-row LED substrate or multi-row LED wiring member as viewed from the external-terminal side, FIG. 1B is a plan view that shows one example of the configuration of laminated pieces of plating layers and a resin layer in each of individual LED substrate regions or LED wiring member regions arranged in the multi-row LED substrate or multi-row LED wiring member shown in FIG. 1A, FIG. 1C is a cross-sectional view taken along a line B-B of FIG. 1B, FIG. 1D is a cross-sectional view that shows an example of each individual LED substrate, FIG. 1E is a cross-sectional view that shows a first example of each individual LED wiring member, and FIG. 1F is a cross-sectional view that shows a second example of each individual LED wiring member. FIGS. 2A to 2K are explanatory diagrams that show examples of manufacturing procedure according to a first embodiment mode of the present invention respectively for the multi-row LED substrate and the multi-row LED wiring member; FIGS. 2A to 2I show a manufacturing procedure for the multi-row LED substrate shown in FIG. 1D, FIGS. 2A to 2J show a manufacturing procedure for the first example of multi-row LED wiring member shown in FIG. 1E, and FIGS. 2A to 2K show a manufacturing procedure for the second example of multi-row LED wiring member shown in FIG. 1F. FIGS. 3A to 3H are explanatory diagrams that show one example of manufacturing procedure for LED packages using the multi-row LED substrate and the multi-row LED wiring member shown in FIGS. 1A to 1F.

The multi-row LED substrate or multi-row LED wiring member of this embodiment mode has a collective of LED substrates 10' or LED wiring members 10 arrayed in a matrix as shown in FIG. 1A.

As shown in FIG. 1D, each LED substrate 10' includes a metal plate 1, a permanent resist 15' as a resin layer, a first plating layer 11 to become an LED-element mount portion and an internal terminal, and a plating layer 13 to become an external terminal. It is noted that the resin layer may be made of a resin member instead of the permanent resist 15'.

As shown in FIG. 1E and FIG. 1F, each LED wiring member 10 includes the permanent resist 15', the first plating layer 11 to become the LED-element mount portion and the plating layer 13 to become the external terminal.

In each LED wiring member 10 shown in FIG. 1E and FIG. 1F, the first plating layer 11 is formed to have a first surface thereof arranged at predetermined sites in a first surface $15a'$ of the permanent resist 15' to be uncovered at a same level as the first surface $15a'$ of the permanent resist 15'.

The other-side surface (second surface) of the first plating layer 11 is a roughened surface.

The second plating layer 13 is formed on a partial region within a region of the second surface of the first plating layer 11 (for example, 0.03 mm or more inward from the outer edge of the first plating layer 11), to have a surface thereof uncovered on a side of a second surface $15b'$ of the permanent resist 15'.

The first plating layer 11 is composed of, for example, an Ag plating layer, an Au plating layer, a Pd plating layer, and a Ni plating layer or a Cu plating layer laminated one on another in this order. The Ag plating layer is composed of an Ag plating layer not containing Se or S.

The second plating layer 13 is composed of, for example, a Ni plating layer, a Pd plating layer, and an Au plating layer laminated one on another in this order.

The first surface of the first plating layer 11, which is uncovered on the first-surface side of the permanent resist 15' of each LED wiring member 10, is configured of a surface of the Ag plating layer formed by removal of the metal plate, which is provided in the multi-row LED substrate 10.

Laminated pieces of the plating layer 11 and the plating layer 13 substantially have a T-shape or L-shape as viewed from a lateral side.

The LED wiring member 10 shown in FIG. 1F is configured so that a reflector resin portion 15 is formed on the first surface of the permanent resist 15' as surrounding a pad portion and a lead portion.

The multi-row LED substrate 10' is configured to have the metal plate 1 made of a Cu material, whereas the multi-row LED wiring member 10 is configured so that the first surface of the first plating layer 11 (the surface of the Ag plating layer), which is uncovered on the side of the first surface of the permanent resist 15', is formed by dissolving the Cu material.

Alternatively, the multi-row LED substrate 10' may be configured to have the metal plate 1 made of an SUS material, whereas the multi-row LED wiring member 10 may be configured so that the first surface of the first plating layer 11 (the surface of the Ag plating layer), which is uncovered on the side of the first surface of the permanent resist 15', is formed by ripping off the SUS material.

The multi-row LED substrate and the multi-row LED wiring member according to the first embodiment mode thus configured can be manufactured, for example, as follows. Description of pre-treatment and post-treatment including chemical cleaning, aqueous washing and the like carried out in each step of the manufacturing is omitted for convenience's sake.

Figure 2A:
FIGS. 2A to 2K are explanatory diagrams that show examples of manufacturing procedure according to a first embodiment mode of the present invention respectively for the multi-row LED substrate and the multi-row LED wiring member.
Figure 2B:
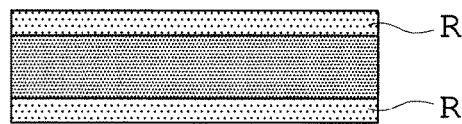

First, a dry film resist R for a first resist mask is made to laminate both sides of the metal plate shown in FIG. 2A (See FIG. 2B). A Cu material is used for the metal plate 1.

Figure 2C:
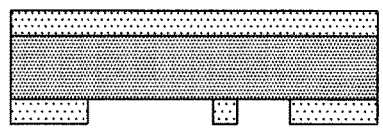

Next, the dry film resist R on the lower surface of the metal plate 1 is exposed and developed upon use of a glass mask that carries a pattern (here, referred to as a pattern A) for forming, at predetermined sites, bottoms of LED-element mount portions and internal terminals, which belong to pad portions and lead portions, respectively, and the dry film resist R on the upper surface of the metal plate 1 is exposed and developed upon use of a glass mask that allows the entire surface to be exposed. Then, as shown in FIG. 2C, a first resist mask carrying the pattern A is formed on the lower surface of the metal plate 1, and a first resist mask covering the entire surface of the metal plate 1 is formed on the upper surface of the metal plate 1. The exposure and development is carried out by a conventional known method. For example, a dry film resist as covered with a glass mask is irradiated with ultraviolet rays, for lowering its solubility in a developer at sites irradiated with the ultraviolet rays passing through the glass mask and then removing the rest of the dry film resist other than these sites, thereby to form a resist mask. Here, while a negative-type dry film resist is used as the resist, a negative-type liquid resist may be used for formation of a resist mask. Further, a dry film resist or liquid resist of positive type may be used, for increasing its solubility in a developer at sites irradiated with the ultraviolet rays passing through a glass mask and then removing these sites, thereby to form a resist mask.

Then, Ag plating, Au plating and Pd plating are respectively applied to the sites not covered with the first resist mask on the metal plate 1, so that, for example, an Ag plating layer, an Au plating layer and a Pd plating layer are formed in this order to have predetermined thicknesses respectively (for example, Ag plating layer of 2.0 µm, Au plating layer of 0.003 µm, and Pd plating layer of 0.03 µm) as the first plating layer 11. The Ag plating is matte Ag plating using an Ag plating solution to which a brightener, which contains Se or S, is not added.

Figure 2D:
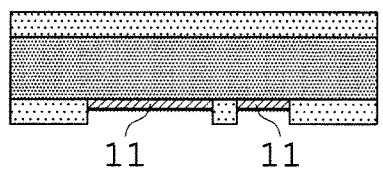

After that, for example, a Ni plating layer (or a Cu plating layer) is applied to the Pd plating layer, for example about 2 µm. Preferably, the Ni plating layer (or the Cu plating layer) is subjected to roughening treatment. FIG. 2D shows the state at this stage.

The total thickness of the first plating layer 11 should be 5 µm or smaller. A thickness over 5 µm is not preferable because, in forming a later-described second resist mask, which is used for forming the second plating layer, as covering the first resist layer 11, too high a projection from the metal plate is liable to let air inside the second resist mask.

In the case where a Ni plating layer is formed on the Pd plating layer at the step of forming the first plating layer 11, the roughening treatment on the Ni plating layer is carried out by etching on the surface of the Ni plating layer. Alternatively, it may be carried out by surface-roughening Ni plating in which course crystals of Ni are formed. Also, in the case where a Cu plating layer is formed on the Pd plating layer, the roughening treatment on the Cu plating layer is carried out by subjecting the surface of the Cu plating layer to anodizing treatment or to etching.

Figure 2E:
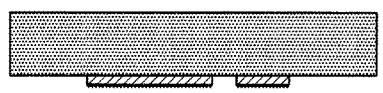

Then, the first resist masks on both sides are removed (see FIG. 2E). After that, a permanent resist 15' made of a solder resist is provided on the lower surface of the metal plate, and a dry film resist R2 is made to laminate the upper surface of the metal plate 1 (see FIG. 2F).

Next, the permanent resist 15' on the lower surface is exposed and developed upon use of a glass mask that carries a pattern (here, referred to as a pattern B) for forming a plating layer additionally placed on sites that are to become external terminals and are a partial region within the region of the previously-formed first plating layer, and the dry film resist R2 on the upper surface is exposed and developed upon use of a glass mask that allows the entire surface to be exposed. Then, as the second resist masks, a resist mask made of the permanent resist 15' carrying the pattern B is formed on the lower surface and a resist mask covering the entire surface is formed on the upper surface (see FIG. 2G).

Then, for example, Ni plating, Pd plating and Au plating are applied to the surface not covered with the second resist mask, of the Ni plating layer (or a Cu plating layer) included in the first plating layer 11, so that, as the second plating layer 13, a Ni plating layer, a Pd plating layer and an Au plating layer respectively having predetermined thicknesses are formed in this order and so that the level of the surface of the uppermost layer (Au plating layer) is not higher than the level of the surface of the second resist mask. FIG. 2H shows the state at this stage. Preferably, each plating is performed so that a recess is formed by the surface of the uppermost plating layer lower by about 3 to 13 µm than the surface of the second resist mask. By doing so, in such a case where the LED package is to be soldered to an external device, the solder tends to remain in the recess, and thus solder bleeding can be prevented. The Ni plating layer is formed to have a thickness of, for example, 20 to 50 µm. Without providing a Ni plating layer, Pd plating and Au plating may be performed so that a Pd plating layer and an Au plating layer respectively having predetermined thicknesses are formed in this order. In addition, as a metal constituting the plating layer that is to become the external-terminal bonding surface of the second plating layer 13, a kind that is solder-bondable to an external base material can be appropriately selected among Ni, Pd, Au, Sn and the like.

Figure 2F:
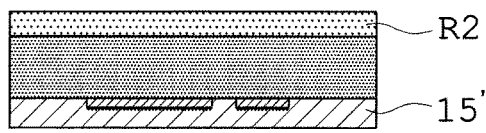
Figure 2G:
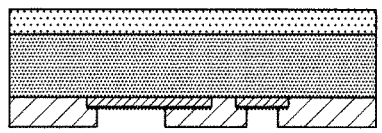
Figure 2H:
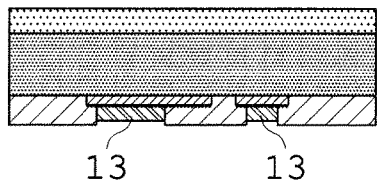
Figure 2I:
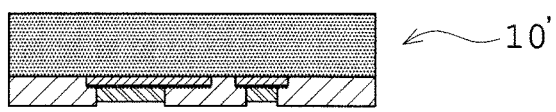

Then, the second resist mask formed on the upper surface of the metal plate 1 is removed (see FIG. 2I). Thereby, the multi-row LED substrate 10' shown in FIG. 1D is completed.

Figure 2J:

Next, the metal plate 1 made of a Cu material is removed from the multi-row LED substrate 10' (see FIG. 2J). Thereby, the multi-row LED wiring member 10 of a first example of this embodiment mode shown in FIG. 1E is completed. Here, the reflectance of the surface of the uppermost Ag plating layer in the first plating layer 11 is higher than the reflectance of the surface of an Ag plating layer in a reflective plating layer 11 that is formed, as conventionally done, by plating a metal plate made of Cu or the like as a lead frame base material so that the uppermost layer is the Ag plating layer.

It is noted that the multi-row LED substrate 10' may have the metal plate made of an SUS material. In this case, the multi-row LED wiring member 10 is completed by ripping-off of the SUS material.

Figure 2K:
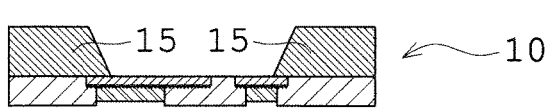

Next, a reflector resin portion 15 surrounding each set composed of a pad portion and a lead portion is formed on the upper surface of the permanent resist 15' in the multi-row LED wiring member 10 (see FIG. 2K). Thereby, the multi-row LED wiring member 10 of a second example of this embodiment mode shown in FIG. 1F is completed.

Manufacturing of LED packages that uses the multi-row LED substrate and the multi-row LED wiring member of this embodiment mode thus manufactured is conducted as follows. FIGS. 3A to 3H are explanatory diagrams that show one example of manufacturing procedure for LED packages that uses the multi-row LED substrate and the multi-row LED wiring member shown in FIGS. 1A to 1F.

Figure 3A:
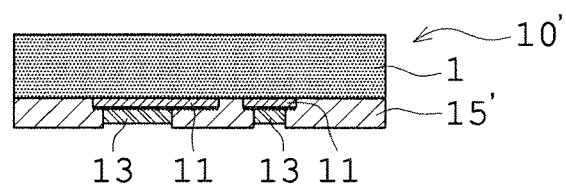
FIGS. 3A to 3H are explanatory diagrams that show one example of manufacturing procedure for LED packages using the multi-row LED substrate and the multi-row LED wiring member shown in FIGS. 1A to 1F.
Figure 3B:
Figure 3C:
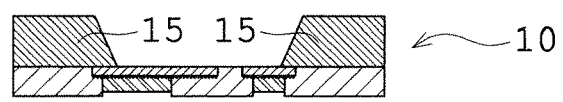
Figure 3D:
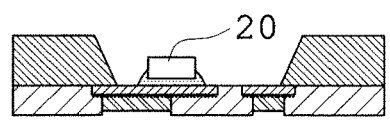

The multi-row LED wiring member 10 of the first example is manufactured upon use of the multi-row LED substrate 10' in a processing procedure similar to that described in reference to FIGS. 2I to 2K, and then the multi-row LED wiring member 10 of the second example is manufactured upon use of the multi-row LED wiring member 10 of the first example (see FIGS. 3A to 3C).

Figure 3E:
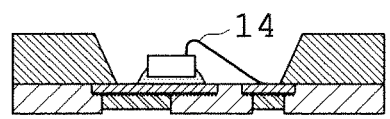

Then, in each individual LED wiring member shown in FIG. 3C in the multi-row LED wiring member, an LED element 20 is mounted on the side of the internal-terminal surface of the pad portion and is connected with the internal terminal, a gap between the LED element 20 and the pad portion is sealed with a predetermined sealing material 17 (see FIG. 3D), and the LED element 20 and the lead portion are connected via a bonding wire 14 (see FIG. 3E). In the multi-row LED wiring member 10 of this embodiment mode, since the surface of the internal terminal as uncovered is at the same level as the upper surface 15a' of the permanent resist 15', the LED element 20 can be mounted in a stable position.

Figure 3F:
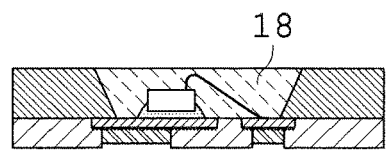

Then, the space in which the LED element 20 is mounted as surrounded by the reflector resin portion 15 is charged with a transparent resin, to be sealed upon forming a transparent resin portion 18 (see FIG. 3F).

Figure 3G:
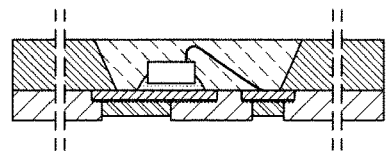

Then, cutting is made into individual LED package regions (see FIG. 3G). Thereby, LED packages are completed (see FIG. 3H).

An LED package as completed is mounted on an external member. In this case, since only the external terminal is left uncovered in reference to the permanent resist, it can be easily connected with a connecting terminal provided on the external member.

According to the multi-row LED substrate 10' of this embodiment mode, since the first plating layer 11 including an Ag plating layer is formed on the metal plate 1 at predetermined sites corresponding to pad portions and lead portions in such a manner that the Ag plating layer is in contact with the surface of the metal plate 1, the upper surface of the first plating layer 11, which is to become internal terminals, is formed of the upper surface of the Ag plating layer by removal of the metal plate 1.

According to the multi-row LED wiring member 10 of this embodiment mode, since the upper surface of the first plating layer, which is to become internal terminals, is formed of the upper surface of the Ag plating layer by removal of the metal plate 1, even if the Ag plating layer is formed by use of an Ag plating solution to which no brightener is added, the metal-plate-1-removal side surface of the Ag plating layer maintains a reflectance comparable to the reflectance of the top surface of an Ag plating layer formed by use of an Ag plating solution containing a brightener, as the uppermost layer of a reflective plating layer formed by, as conventionally conducted, plating a metal plate of Cu or the like as a lead frame base material. Accordingly, in the LED wiring member, the first plating layer 11 forms a reflective plating layer on the LED-element mount side. Therefore, according to the multi-row LED wiring member 10 of this embodiment mode, it is possible to maintain a good reflection efficiency of the surface of the reflective plating layer without adding a brightener. Accordingly, even if the reflective surface is formed by matte Ag plating for manufacturing cost saving and easier control of the plating solution in manufacturing, a reflection efficiency for LED light suitable for an LED package can be achieved.

Also, according to the multi-row LED wiring member of this embodiment mode, since the Ag plating layer in the first plating layer is an Ag plating layer not containing Se or S, addition of a brightener containing Se or S is dispensable, and thus the cost can be reduced for it.

In the multi-row LED wiring member 10 of this embodiment mode, the lower surface of the first plating layer being formed as a roughened surface improves its adhesion to the resin layer (in this embodiment mode, the permanent resist 15').

Also, in the multi-row LED wiring member 10 of this embodiment mode, the upper surface of the resin layer being formed as a rough surface improves its adhesion to the reflector resin portion formed on the LED-element mount side and to the transparent resin that seals the LED mount region.

According to the LED wiring member 10 of this embodiment mode, since the first plating layer 11 and the second plating layer 13, which is to form external terminals, constitute laminated pieces of plating layers, the instrumentation pitch of LED-element mount portions with internal terminals and the instrumentation pitch of external terminals are individually adjustable in accordance with design.

Also, since the laminated pieces constituted of the first plating layer and the second plating layer have a T-shape or L-shape as viewed from a lateral side, the adherence to the resin layer (in this embodiment mode, the permanent resist 15') is improved, to prevent the coating by plating, which forms LED-element mount portions and terminals, from coming off the resin layer (in this embodiment mode, the permanent resist 15').

Also, since the configuration is made so that the second plating layer 13 is formed on a partial region within a region of the second surface of the first plating layer 11, pieces of the second plating layer, which are to form external terminals, can be made small, to prevent the second plating layer 11, which is uncovered as the external terminals on the back surface of the LED package, from falling off or coming off.

According to the multi-row LED wiring member of this embodiment mode, since the multi-row LED wiring member is constituted only of the laminated coating by plating and the resin layer (in this embodiment mode, the permanent resist 15'), to form the reflector resin portion 15 around the pad portions and the lead portions on the LED-element-mount side or to resin-seal the LED elements 20 after instrumentation with the transparent resin 18 means to seal only the permanent resist 15' and the coating by plating as uncovered of the multi-row LED wiring member with a sealing resin, which forms the reflector resin portion 15 or the transparent resin portion 18, without resin-sealing a surface of a base material (metal plate) having a greatly different expansion coefficient, and thus warpage after curing of the sealing resin is reduced. In more detail, as compared with resin-sealing of a metal plate serving as a base material, resin-sealing of the resin layer (in this embodiment mode, the permanent resist 15') constituting the multi-row LED wiring member involves a small difference in thermal contraction and thermal expansion after curing of the sealing resin between the resin layer (in this embodiment mode, the permanent resist 15') and the sealing resin, for these two materials are of the same type having similar physical characteristics. As a result, warpage after curing of the sealing resin is made small.

Also, according to the multi-row LED wiring member 10 of this embodiment mode, since the multi-row LED wiring member is constituted only of the laminated coating by plating and the resin layer (in this embodiment mode, the permanent resist 15'), in obtaining individual LED packages from the multi-row LED package in which a plurality of LED package regions are arrayed, almost all the portions to be cut by blades are of the resin layer (in this embodiment mode, the permanent resist 15') and the reflector resin portion 15, except a small part of the outer frame portion.

As a result, the amount of metal, which forms the base material of the lead frame, to be cut can be greatly reduced as compared with a conventional LED package having coupling portions as in the LED package described in JP KOKAI No. 2013-232506. It is possible to remarkably reduce unfavorable influence on the blades in the cutting process and to prolong the continuous productivity and life of the blades.

Also, according to the multi-row LED wiring member 10 of this embodiment mode, since the pad portions and the lead portions are formed to be spaced from each other and are fixed by the resin layer (in this embodiment mode, the permanent resist 15'), in the manufacturing procedure of LED packages, it is not necessary, after the transparent resin portion 18 being provided to fill inside spaces where LED elements 20 are mounted, to perform etching against a metal plate forming a lead frame base material as conventionally would have been performed for separating the pad portions and the lead portions.

As a result, that the transparent resin portion 18 would never come into contact with an etchant, which would alter the surface quality thereof for a lower transmittance, relieves the anxiety about quality deterioration such as a weakened amount of illumination light from LED devices to be manufactured.

Further, that the etching is dispensable after the transparent resin portion 18 is provided in the manufacturing procedure of LED packages relieves an anxiety that an etchant would infiltrate the LED mount region filled with the transparent resin portion 18 from the interface between the transparent resin portion 18 and the reflector resin portion 15 to unfavorably affects the circuit of the LED devices.

Also, according to the multi-row LED wiring member of this embodiment mode, since the multi-row LED wiring member is constituted only of the laminated coating by plating and the resin layer (in this embodiment mode, the permanent resist 15'), at the stage where there has been manufactured a multi-row LED package in which a plurality of LED package regions are arrayed, which is a pre-stage for obtaining individual LED packages, laminated pieces constituting a pad portion and a lead portion in each individual lead frame region, laminated pieces constituting pad portions and lead portions in other lead frame regions, and the resin layer (in this embodiment mode, the permanent resist 15') used in manufacturing the multi-row lead frame are integrally connected together without being separated, and there is no coupling portions made of a metal as a lead frame base material.

As a result, the width between the pad portion or the lead portion in each lead frame region and the pad portions or the lead portions in other lead frame regions can be narrowed, so that a larger number of individual lead frames can be formed within the area for forming a multi-row LED lead frame, to achieve remarkable integration in manufacturing. Moreover, unlike the LED package described in JP KOKAI No. 2013-232506, it is not necessary to endeavor to design the pad portion and the lead portion regarding shapes thereof and positions thereat to be connected with the coupling portion for preventing deformation of the connecting portion. Therefore, a greater latitude is given about design of the pad portion and the lead portion.

In this way, according to this embodiment mode, it is possible to obtain a multi-row LED wiring member and a manufacturing method therefor in which the reflectance of the surface of the reflective plating layer can be maintained without addition of a brightener. Also, according to this embodiment mode, it is possible to obtain a multi-row LED wiring member and a manufacturing method therefor in which: warpage after curing of the sealing resin can be reduced; the continuous productivity and life of blades used in the process of cutting into individual LED packages are allowed to be prolonged; the transparent resin portion filling the LED-element mount portion is free from influence by an etchant; the LED-element mount portion is free from infiltration by an etchant; and a great latitude is given about design.

Second Embodiment Mode

FIGS. 4A to 4J are explanatory diagrams that show examples of manufacturing procedure according to a second embodiment mode of the present invention respectively for the multi-row LED substrate and the multi-row LED wiring member; FIGS. 4A to 4H show a manufacturing procedure for the multi-row LED substrate shown in FIG. 1D, FIGS. 4A to 4I show a manufacturing procedure for the first example of multi-row LED wiring member shown in FIG. 1E, and FIGS. 4A to 4J show a manufacturing procedure for the second example of multi-row LED wiring member shown in FIG. 1F.

Figure 4A:
FIGS. 4A to 4J are explanatory diagrams that show examples of manufacturing procedure according to a second embodiment mode of the present invention respectively for the multi-row LED substrate and the multi-row LED wiring member.
Figure 4B:
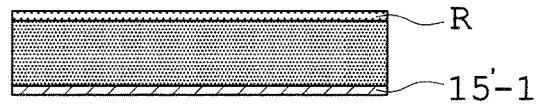

In the manufacturing procedure of the second embodiment mode for a multi-row LED substrate and a multi-row LED wiring member, first, a first permanent resist 15'-1 made of a solder resist is provided on the lower surface of a metal plate shown in FIG. 4A, and a dry film resist R for a first resist mask is made to laminate the upper surface of the metal plate 1 (see FIG. 4B). A Cu material is used for the metal plate 1.

Figure 4C:
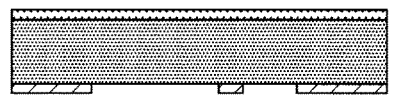

Next, the first permanent resist 15'-1 on the lower surface of the metal plate 1 is exposed and developed upon use of a glass mask that carries a pattern (here, referred to as a pattern A) for forming, at predetermined sites, bottoms of LED-element mount portions and internal terminals, which belong to pad portions and lead portions, respectively, and the dry film resist R on the upper surface of the metal plate 1 is exposed and developed upon use of a glass mask that allows the entire surface to be exposed. Then, as shown in FIG. 4C, a first resist mask carrying the pattern A is formed on the lower surface of the metal plate 1, and a first resist mask covering the entire surface of the metal plate 1 is formed on the upper surface of the metal plate 1.

Figure 4D:
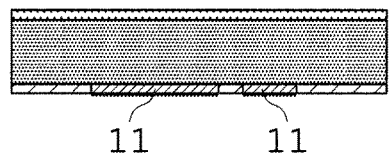

Next, a first plating layer 11 is formed at sites not covered with the first resist mask on the metal plate 1, in substantially the same manner as in the first embodiment mode (see FIG. 4D).

Figure 4E:
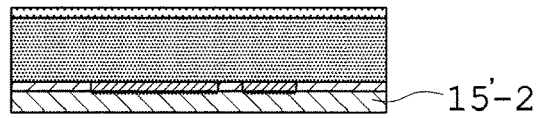

Then, on the lower surface of the first resist mask made of the first permanent resist 15'-1 and the first plating layer 11, a second permanent resist 15'-2 made of a solder resist is provided (see FIG. 4E).

Figure 4F:
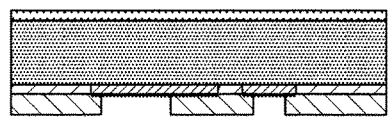

Then, the second permanent resist 15'-2 on the lower surface is exposed and developed upon use of a glass mask that carries a pattern (here, referred to as a pattern B) for forming a plating layer additionally placed on sites that are to become external terminals and are a partial region within the region of the previously-formed first plating layer, to form a resist mask made of the second permanent resist 15'-2 on the lower surface, as a second resist mask carrying the pattern B (see FIG. 4F).

Figure 4G:
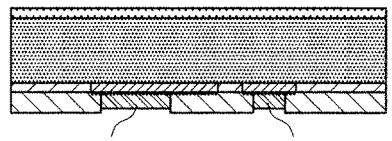

Next, a second plating layer 13 is formed on a surface of a Ni plating layer (or a Cu plating layer) included in the first plating layer 11 at sites not covered with the second resist mask in substantially the same manner as in the first embodiment mode (see FIG. 4G).

Figure 4H:
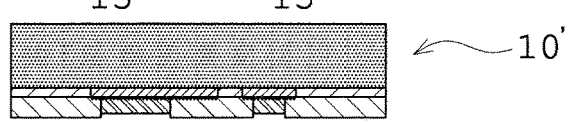
Figure 4I:
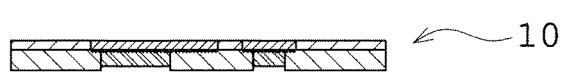
Figure 4J:

Then, the first resist mask formed on the upper surface of the metal plate 1 is removed (see FIG. 4H).

Thereby, the multi-row LED substrate 10' provided with the configuration shown in FIG. 1D is completed.

The subsequent processes (see FIGS. 4I to 4J) for manufacturing the first example of multi-row LED wiring member 10 or the second example of multi-row LED wiring member 10 are substantially the same as the manufacturing processes in the first embodiment mode shown in FIGS. 2J to 2K.

According to the manufacturing method of the second embodiment mode for a multi-row LED substrate/wiring member, the step of removing, from the lower surface of the metal plate 1, the first resist mask used for forming the first plating layer 11 can be omitted, and thus the manufacturing cost therefor can be reduced as well as the efficiency of manufacture is improved.

Third Embodiment Mode

FIGS. 5A to 5I are explanatory diagrams that show examples of manufacturing procedure according to a third embodiment mode of the present invention respectively for the multi-row LED substrate and the multi-row LED wiring member; FIGS. 5A to 5G show a manufacturing procedure for the multi-row LED substrate shown in FIG. 1D, FIGS. 5A to 5H show a manufacturing procedure for the first example of multi-row LED wiring member shown in FIG. 1E, and FIGS. 5A to 5I show a manufacturing procedure for the second example of multi-row LED wiring member shown in FIG. 1F.

In the manufacturing procedure of the third embodiment mode for a multi-row LED substrate and a multi-row LED wiring member, the steps from formation of a first resist mask carrying a pattern A made of a first permanent resist 15'-1 on the lower surface of a metal plate 1 to formation of a first resist mask made of a photoresist covering entirety of the upper surface of the metal plate 1 (see FIGS. 5A to 5C) are carried out in substantially the same manner as in the manufacturing procedure according to the second embodiment mode shown in FIGS. 4A to 4C.

Figure 5A:
FIGS. 5A to 5I are explanatory diagrams that show examples of manufacturing procedure according to a third embodiment mode of the present invention respectively for the multi-row LED substrate and the multi-row LED wiring member.
Figure 5B:
Figure 5C:
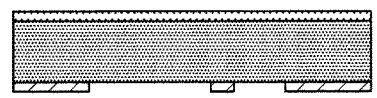
Figure 5D:
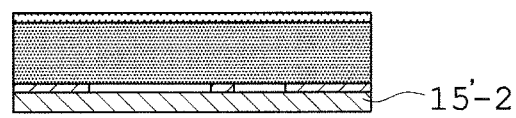

Then, a second permanent resist 15'-2 made of a dry film type solder resist is made to laminate the lower surface of the first resist mask made of the first permanent resist 15'-1 (see FIG. 5D).

Figure 5E:
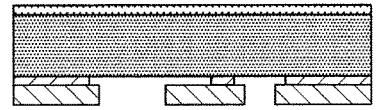
Figure 5F:
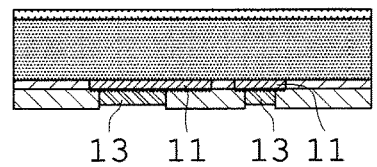

Then, the second permanent resist 15'-2 on the lower surface is exposed and developed upon use of a glass mask that carries a pattern (here, referred to as pattern B) for leaving a partial region within a region of openings in the first resist mask uncovered, to form a resist mask made of the second permanent resist 15'-2 on the lower surface, as a second resist mask carrying the pattern B (see FIG. 5E).

Then, a first plating layer 11 including an Ag plating layer is formed by plating on the metal plate 1 at sites left uncovered at openings in the first resist mask made of the permanent resist 15' so that the Ag plating layer is in contact with the lower surface of the metal plate 1, in substantially the same manner as in the first embodiment mode. Further, a second plating layer 13 is further formed on the surface of a Ni plating layer (or a Cu plating layer) included in the first plating layer 11 at sites left uncovered at openings in the second resist mask made of the second permanent resist 15'-2, in substantially the same manner as in the first embodiment mode (see FIG. 5F).

Figure 5G:
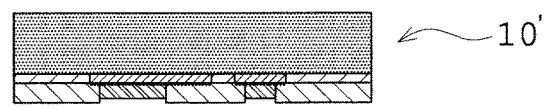
Figure 5H:
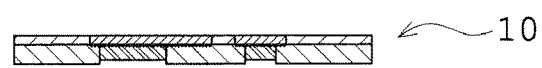
Figure 5I:

Then, the first resist mask formed on the upper surface of the metal plate 1 is removed (see FIG. 5G).

Thereby, the multi-row LED substrate 10' provided with the configuration shown in FIG. 1D is completed.

The subsequent processes (see FIGS. 5H to 5I) for manufacturing the first example of multi-row LED wiring member 10 or the second example of multi-row LED wiring member 10 are substantially the same as the manufacturing processes in the first embodiment mode shown in FIGS. 2J to 2K.

According to the manufacturing method of the third embodiment mode for a multi-row LED substrate/wiring member, the first plating layer 11 and the second plating layer 13 are allowed to be formed in one plating process, and thus much improved efficiency of manufacture can be achieved.

Fourth Embodiment Mode

FIGS. 6A to 6G are explanatory diagrams that show examples of manufacturing procedure according to a fourth embodiment mode of the present invention respectively for the multi-row LED substrate and the multi-row LED wiring member; FIGS. 6A to 6E show a manufacturing procedure for the multi-row LED substrate shown in FIG. 1D, FIGS. 6A to 6F show a manufacturing procedure for the first example of multi-row LED wiring member shown in FIG. 1E, and FIGS. 6A to 6G show a manufacturing procedure for the second example of multi-row LED wiring member shown in FIG. 1F.

Figure 6A:
FIGS. 6A to 6G are explanatory diagrams that show examples of manufacturing procedure according to a fourth embodiment mode of the present invention respectively for the multi-row LED substrate and the multi-row LED wiring member.
Figure 6B:
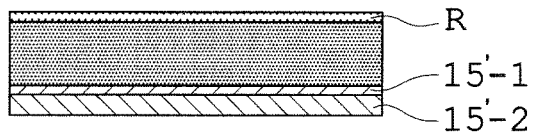
Figure 6C:
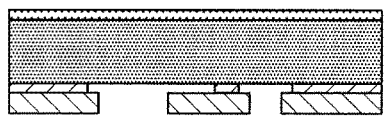

In the manufacturing procedure of the fourth embodiment mode for a multi-row LED substrate and a multi-row LED wiring member, first, a first permanent resist 15'-1 made of a solder resist as a first resist layer and a second permanent resist 15'-2 made of a solder resist as a second resist layer are formed in this order on the lower surface of a metal plate 1 shown in FIG. 6A, as well as a dry film resist R for a first resist mask is made to laminate the upper surface of the metal plate 1 (see FIG. 6B). A Cu material is used for the metal plate 1.

Next, exposure with a first wavelength directed to the first permanent resist 15'-1 on the lower surface of the metal plate 1 is carried out upon use of a glass mask that carries a pattern (here, referred to as a pattern A) for forming, at predetermined positions, bottoms of LED-element mount portions and internal terminals, which belong to pad portions and lead portions, respectively. Also, exposure with a second wavelength directed to the second permanent resist 15'-2 on the lower surface of the metal plate 1 is carried out upon use of a glass mask that carries a pattern (here, referred to as a pattern B) for leaving a partial region within a region of openings in the pattern A uncovered. Then, the first permanent resist 15'-1 and the second permanent resist 15'-2 are simultaneously developed, to form, on the lower surface of the metal plate 1, a first resist mask having openings in the pattern A and a second resist mask having openings in the pattern B (see FIG. 6C). Regarding the dry film resist R on the upper surface, exposure and development is carried out upon use of a glass mask that let the entire surface irradiated, to form a first resist mask that covers the entire surface.

Figure 6D:
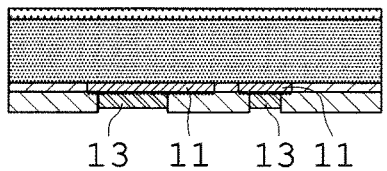
Figure 6E:
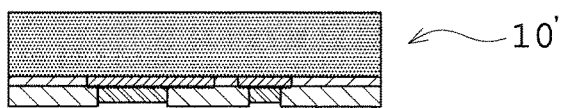
Figure 6F:
Figure 6G:
Figure 7A:
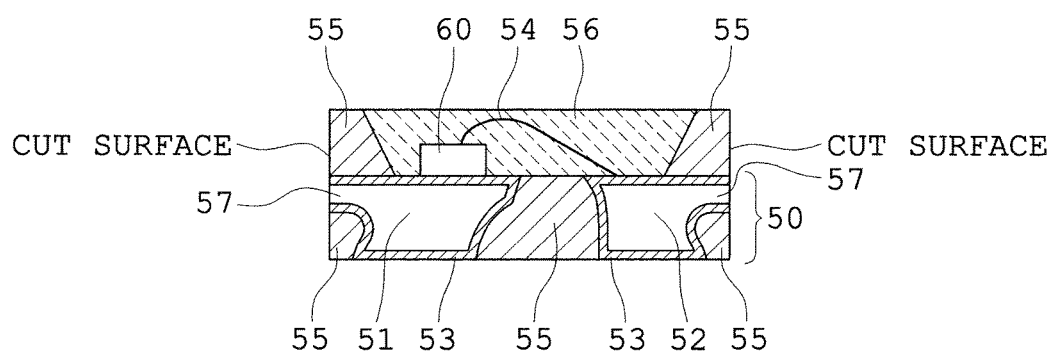
FIGS. 7A and 7B are diagrams that show a schematic configuration of a conventional LED package, where
Figure 7B:
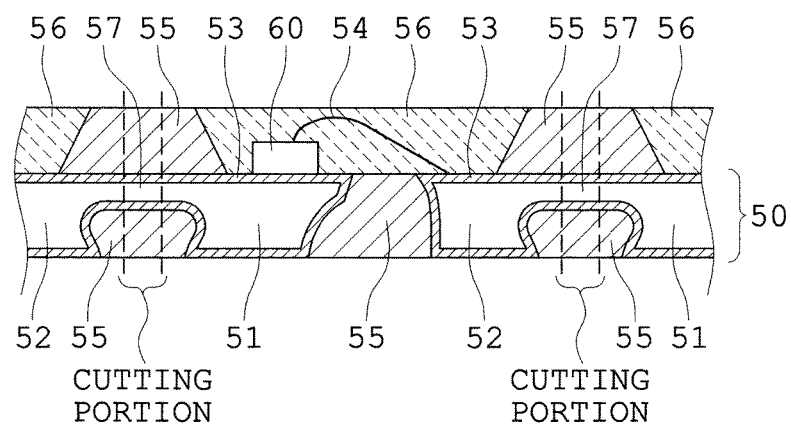
Figure 8A:
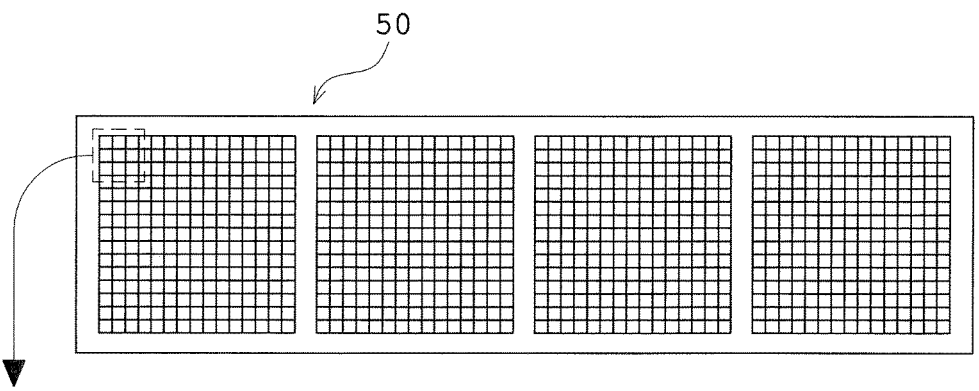
FIGS. 8A to 8C are diagrams that show a schematic configuration of a multi-row LED lead frame used for manufacturing a conventional LED package, where
Figure 8B:
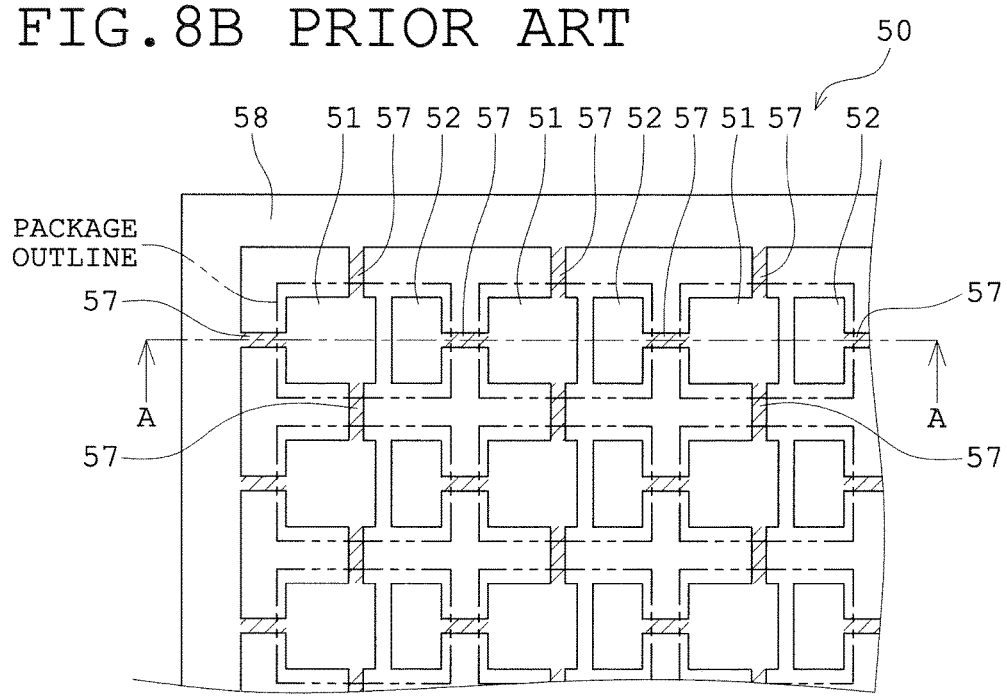
Figure 8C:
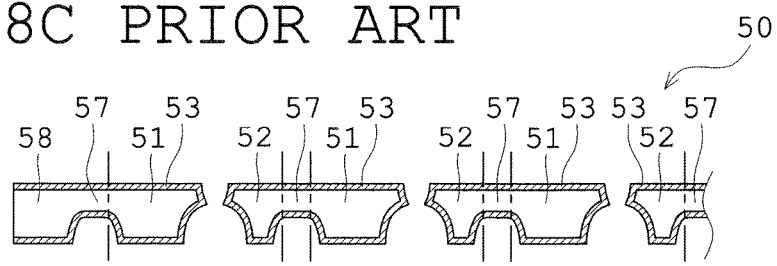

After that, a first plating layer 11 and a second plating layer 13 are formed in substantially the same manner as in the third embodiment mode (see FIG. 6D). Further, the first resist mask formed on the upper surface of the metal plate 1 is removed (see FIG. 6E).

Thereby, the multi-row LED substrate 10' provided with the configuration shown in FIG. 1D is completed.

The subsequent processes (see FIGS. 6F to 6G) for manufacturing the multi-row LED wiring member 10 of the first example or the multi-row LED wiring member 10 of the second example are substantially the same as the manufacturing processes in the first embodiment mode shown in FIGS. 2J to 2K.

According to the manufacturing method of the fourth embodiment mode for a multi-row LED substrate/wiring member, the first resist mask having pattern-A openings and the second resist mask having pattern-B openings can be formed by one exposure process, and thus much improved efficiency of manufacture can be achieved.

EMBODIED EXAMPLES

Next, description will be made of embodied examples of the manufacturing method of the present invention for the multi-row LED substrate and the multi-row LED wiring member.

Although pre-treatment and post-treatment including chemical cleaning, aqueous washing and the like were carried out in each step, they are common treatment and thus description is omitted.

Embodied Example 1

First, a Cu material having a thickness of 0.15 mm, which is for use as a lead frame material also, was prepared as a metal plate 1 (see FIG. 2A).

In the step of forming a first resist mask, a dry film resist R having a thickness of 25 µm was made to laminate both surfaces of the metal plate 1 (see FIG. 2B). Then, the dry film resist R on the lower surface was subjected to exposure and development upon use of a glass mask that carries a pattern A for forming, at predetermined sites, bottoms of LED-element mount portions and internal terminals, which belong to pad portions and lead portions, respectively, to form a first resist mask that had openings at the sites where plating is to be made. For the dry film resist on the upper surface, exposure and development was carried out upon use of a glass mask that let the entire surface irradiated, to form a first resist mask that covered the entire surface of the metal plate 1. The exposure and development was the same as the conventional method; upon closely fitting a glass mask for exposure to a dry film resist, irradiating them with ultraviolet rays, and carrying out development with sodium carbonate (see FIG. 2C).

In the next plating step, after a common pre-treatment for plating, the metal plate, at sites free from covering by the first resist mask formed on the lower surface thereof, was plated with Ag of 2.0 µm, Au of 0.01 µm, Pd of 0.03 µm, and Ni of 2.0 µm in this order (see FIG. 2D). The Ag plating was matte Ag plating using an Ag plating solution to which a brightener containing Se or S was not added.

Then, the first resist masks on the both surfaces were peeled off (see FIG. 2E), a permanent resist 15' made of a solder resist was applied to the lower surface of the metal plate 1, and a dry film resist R2 was made to laminate the upper surface of the metal plate 1 (see FIG. 2F). At that time, it was necessary to select the thickness of the resist according to the thickness of the second plating layer to be formed. In this embodied example, in order to form the second plating layer to have a thickness of 15 to 40 µm with the surface of the uppermost plating layer not exceeding the height of the surface of the second resist mask, a resist having a thickness of 50 µm was used only for the lower surface side, and a resist having a thickness of 25 µm was used for the upper surface side.

Then, a second resist mask was formed by exposure and development upon use of a glass mask that carried a pattern B for forming a plating layer additionally placed on sites that were to become external terminals and were a partial region within the region of the previously-formed first plating layer (See FIG. 2G). A resist mask covering the entire surface was formed on the upper surface side.

In the next plating step, a Ni plating surface, at sites free from covering by the second resist mask as formed was plated with Ni of 20 µm, Pd of 0.03 µm and Au of 0.01 µm in this order (see FIG. 2H).

Then, the second resist mask on the upper surface was removed, to fabricate a multi-row LED substrate 10' (see FIG. 2I).

Then, the metal plate 1 was removed from the multi-row LED substrate 10' by dissolution, to fabricate a multi-row LED wiring member of the first example in Embodied Example 1 (see FIG. 2J).

Then, on the upper surface of the permanent resist 15' in the multi-row LED wiring member 10, a reflector resin portion 15 surrounding each set composed of a pad portion and a lead portion is formed, to fabricate the multi-row LED wiring member 10 of the second example in Embodied Example 1 (see FIG. 2K).

Embodied Example 2

First, a Cu material substantially the same as that in Embodied Example 1 was prepared as a metal plate 1 (see FIG. 4A).

In the step of forming a first resist mask, a first permanent resist 15'-1 made of a solder resist was applied to a lower surface of the metal plate 1, and a dry-film resist R for the first resist mask was made to laminate an upper surface of the metal plate 1 (see FIG. 4B). Then, the first permanent resist 15'-1 on the lower surface of the metal plate 1 was subjected to exposure and development upon use of a glass mask that carries a pattern A for forming, at predetermined sites, bottoms of LED-element mount portions and internal terminals, which belong to pad portions and lead portions, respectively, and the dry film resist R on the upper surface of the metal plate 1 was subjected to exposure and development upon use of a glass mask that let the entire surface irradiated, to form, on the lower surface of the metal plate 1, a first resist mask that carried the pattern A and, on the upper surface of the metal plate 1, a first resist mask that covered the entire surface of the metal plate 1 (see FIG. 4C).

In the next plating step, a first plating layer 11 was formed, on the metal plate 1, at sites free from covering by the first resist mask in substantially the same manner as in Embodied Example 1 (see FIG. 4D).

Then, a second permanent resist 15'-2 made of a solder resist was applied to the lower surface of the first resist mask made of the first permanent resist 15'-1 and the first plating layer 11 (see FIG. 4E).

Then, the second permanent resist 15'-2 on the lower surface was exposed and developed upon use of a glass mask that carried a pattern B for forming a plating layer additionally placed on sites that were to become external terminals and were a partial region within the region of the previously-formed first plating layer, to form, on the lower surface, a resist mask made of the second permanent resist 15'-2 carrying the pattern B, as the second resist mask (see FIG. 4F).

In the next plating step, a surface of the Ni plating layer (or a Cu plating layer) included in the first plating layer 11, at sites free from covering by the second resist mask was plated with a second plating layer 13 in substantially the same manner as in Embodied Example 1 (see FIG. 4G).

After that, in accordance with manufacturing processes similar to Embodied Example 1, a multi-row LED substrate 10' (see FIG. 4H), a first example of multi-row LED wiring member 10 in Embodied Example 2 (see FIG. 4I), a second example of multi-row LED wiring member 10 in Embodied Example 2 (see FIG. 4J) were respectively fabricated.

Embodied Example 3

First, a Cu material substantially the same as that in Embodied Example 1 was prepared as a metal plate 1 (see FIG. 5A).

The step of forming a first resist mask was conducted in substantially the same manner as the manufacturing step in Embodied Example 2 (see FIGS. 5B and 5C).

Next, a second permanent resist 15'-2 made of a dry-film type solder resist was made to laminate the lower surface of the first resist mask formed of the first permanent resist 15'-1 (see FIG. 5D).

Then, the second permanent resist 15'-2 on the lower surface was exposed and developed upon use of a glass mask that carried a pattern (here, referred to as a pattern B) for leaving a partial region within a region of the openings in the first resist mask uncovered, to form, on the lower surface, a resist mask made of the second permanent resist 15'-2 carrying the pattern B, as the second resist mask (see FIG. 5E).

Then, a first plating layer 11 was formed on the metal plate 1, at sites therein left uncovered through the openings in the first resist mask formed of the first permanent resist 15'-1, via plating with individual plating layers carried out in such a manner that an Ag plating layer is in contact with the lower surface of the metal plate 1 as in Embodied Example 1. Further, as in Embodied Example 1, a second plating layer 13 was formed, on the surface of a Ni plating layer (or a Cu plating layer) included in the first plating layer 11, at sites therein left uncovered through the openings in the second resist mask formed of the second permanent resist 15'-2 (see FIG. 5F).

After that, in accordance with manufacturing processes similar to Embodied Example 1, a multi-row LED substrate 10' in Embodied Example 3, (see FIG. 5G), a first example of multi-row LED wiring member 10 in Embodied Example 3 (see FIG. 5H), and a second example of multi-row LED wiring member 10 in Embodied Example 3 (see FIG. 5I) were respectively fabricated.

Embodied Example 4

First, a Cu material substantially the same as that in Embodied Example 1 was prepared as a metal plate 1 (see FIG. 6A).

Next, a first permanent resist 15'-1 made of a solder resist and a second permanent resist 15'-2 made of a solder resist were applied to a lower surface of the metal plate 1 in this order, and a dry film resist R for a first resist mask was made to laminate an upper surface of the metal plate 1 (see FIG. 6B).

Then, exposure with a first wavelength directed to the first permanent resist 15'-1 on the lower surface of the metal plate 1 was carried out upon use of a glass mask that carried a pattern A for forming, at predetermined positions, bottoms of LED-element mount portions and internal terminals, which belong to pad portions and lead portions, respectively. Also, exposure with a second wavelength directed to the second permanent resist 15'-2 on the lower surface of the metal plate 1 was carried out upon use of a glass mask that carries a pattern B, for leaving a partial region within a region of openings in the pattern A uncovered. Then, the first permanent resist 15'-1 and the second permanent resist 15'-2 were simultaneously developed, to form, on the lower surface of the metal plate 1, a first resist mask having openings in the pattern A and a second resist mask having openings in the pattern B (see FIG. 6C). Regarding the dry film resist R on the upper surface, exposure and development was carried out upon use of a glass mask that let the entire surface irradiated, to form a first resist mask that covers the entire surface.

Then, a first plating layer 11 and a second plating layer 13 were formed in substantially the same manner as in Embodied Example 3 (see FIG. 6D).

After that, in accordance with manufacturing processes similar to Embodied Example 1, a multi-row LED substrate 10' in Embodied Example 4, (see FIG. 6E), a first example of multi-row LED wiring member 10 in Embodied Example 4 (see FIG. 6F), and a second example of multi-row LED wiring member 10 in Embodied Example 4 (see FIG. 6G) were respectively fabricated.

Figure 3H:
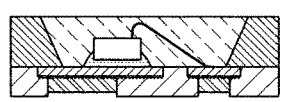

An LED element 20 is mounted on the pad portion on the internal-terminal surface side of the multi-row LED wiring member 10 obtained through the manufacturing method of each embodied example (see FIG. 3D), the LED element 20 and the lead portion were connected via a bonding wire 14 (See FIG. 3E), a transparent resin was filled in a space surrounded by the reflector resin portion 15 and mounting the LED element 20 therein, to form a transparent resin portion 18 as sealed (FIG. 3F), cutting was carried out into the individual LED package areas (see FIG. 3G), and an LED package was obtained (see FIG. 3H).

Comparative Test of Glossiness

A matte Ag plating layer was formed on a Cu material upon use of an Ag plating solution to which a brightener containing Se or S was not added, and the glossiness of the outermost surface of the matte Ag plating layer formed on the Cu material was measured (Test Data 1).

Then, a permanent resist was formed on the matte plating side by use of the same process as in these embodiment modes and embodied examples, the Cu material was dissolved away after formation of the permanent resist, to uncover a matte Ag plating surface, and the glossiness of the matte Ag plating surface as uncovered was measured (Test Data 2).

The measured glossiness of each surface was as follows.

(1) Test Data 1 (outermost surface formed on Cu material): 0.234

(2) Test Data 2 (surface uncovered by removal of Cu material): 1.135

As shown in the above test data, the surface of the matte Ag plating layer uncovered by removal of the Cu material had a markedly higher glossiness than the outermost surface of the matte Ag plating layer formed on the Cu material. The glossiness 1.135 of the surface of the matte Ag plating layer uncovered by removal of the Cu material satisfied the glossiness of bright silver plating used for LED packages, which is formed by use of an Ag plating solution to which a brightener containing Se or S is added, or 1.0 or greater.

While the embodiment modes and the embodied examples of the multi-row LED substrate, the multi-row LED wiring member, and the manufacturing method therefor according to the present invention have been described above, the multi-row LED substrate and the multi-row LED wiring member of the present invention are not limited to the configurations of the above-described embodiment modes and the embodied examples.

For example, while Ag, Au, Pd and Ni are used for the first plating layer and Ni, Pd, and Au are used for the second plating layer in the multi-row LED substrate and the multi-row LED wiring member of the first embodiment mode, the combination of plating used for forming the first plating layer and the second plating layer in the multi-row LED substrate and the multi-row LED wiring member of the present invention is not limited to this. As modified examples, combinations of the first plating layer and the second plated layer formed as shown in the following Table 1 constitute the multi-row LED substrate and the multi-row LED wiring member of the present invention. However, the plating layer closest to the LED-element mount side in the first plating layer to constitute the reflective plating layer should be an Ag plating layer to which a brightener containing Se or S is added.

Table 1 is to be read so that plating with each metal is applied in order from the top of the column in each modified example.

TABLE 1

Combination of plating constituting multi-row LED substrate and multi-row LED wiring member

| Modified example | 1 | 2 | 3 |
| --- | --- | --- | --- |
| 1st plating layer | Ag | Ag | Ag |
|  | Ni | Ni | Pd |
|  |  |  | Ni |
| 2nd plating layer | Au | Pd | Au |
|  |  | Au |  |

What is claimed is:

1. A multi-row LED wiring member comprising:
   a first plating layer having a first surface and a second surface opposite to each other, formed to lie on a reference plane with the first surface coinciding with the reference plane,
   a second plating layer having a third surface and a fourth surface opposite to each other, formed on the second surface of the first plating layer so that the third surface is in contact with the second surface of the first plating layer, and
   a resin layer having a fifth surface and a sixth surface opposite to each other,
   the first plating layer, the second plating layer, and the resin layer forming a plurality of wiring members arrayed in a matrix,
   wherein in each of the plurality of wiring members, a first laminated piece, which is to form a pad portion, and a second laminated piece, which is to form a lead portion, are arranged as supported by the resin layer, each of the first laminated piece and the second laminated piece consisting of the first plating layer and the second plating layer,
   wherein the first surface of the first plating layer is uncovered in the fifth surface of the resin layer at a same level as the fifth surface of the resin layer,
   wherein the second plating layer is formed on a partial region inside the second surface of the first plating layer, to have the fourth surface thereof uncovered in the sixth surface of the resin layer,
   wherein the first laminated piece and the second laminated piece substantially have a T-shape or L-shape as viewed from a lateral side, and
   wherein the first surface of the first plating layer is a surface of an Ag plating layer.

2. The multi-row LED wiring member according to claim 1,
   wherein the Ag plating layer of the first plating layer is an Ag plating layer not containing Se or S.

3. The multi-row LED wiring member according to claim 2,
   wherein a glossiness of the surface of the Ag plating layer is 1.0 or greater.

4. The multi-row LED wiring member according to claim 1,
   providing at least one of a configuration that the second surface of the first plating layer is a roughened surface and a configuration that the fifth surface of the resin layer is a rough surface.

5. The multi-row LED wiring member according to claim 1,
   wherein the resin layer is made of a permanent resist.

6. The multi-row LED wiring member according to claim 1, wherein each of the first laminated piece and the second laminated piece has a total thickness of 55 μm or less.

* * * * *

UNITED STATES PATENT AND TRADEMARK OFFICE
CERTIFICATE OF CORRECTION

PATENT NO. : 10,305,007 B2
APPLICATION NO. : 15/661479
DATED : May 28, 2019
INVENTOR(S) : Kaoru Hishiki et al.

Page 1 of 1

It is certified that error appears in the above-identified patent and that said Letters Patent is hereby corrected as shown below:

On the Title Page

In item (72) Inventors, please change the spelling of the second inventor's name from "Kazunori Iitani, Kagoshima (JP)" to --Ichinori Iidani, Kagoshima (JP)--

Signed and Sealed this
Fourteenth Day of April, 2020

Andrei Iancu
*Director of the United States Patent and Trademark Office*